United States Patent [19]

Nagi

[11] Patent Number: 4,908,870
[45] Date of Patent: Mar. 13, 1990

[54] MOTIONAL LOAD DRIVER

[75] Inventor: Katsuo Nagi, Hamamatsu, Japan

[73] Assignee: Yamaha Corporation, Hamamatsu, Japan

[21] Appl. No.: 249,383

[22] Filed: Sep. 26, 1988

[30] Foreign Application Priority Data

Sep. 30, 1987 [JP] Japan ................................. 62-247714

[51] Int. Cl.$^4$ .............................................. H04R 3/00
[52] U.S. Cl. ......................................... 381/96; 381/59
[58] Field of Search .................................... 381/96, 59

[56] References Cited

U.S. PATENT DOCUMENTS 4,118,600  10/1978  Stahl .
4,797,933   1/1989  Hahne ................................... 381/96

OTHER PUBLICATIONS

"Synthesis of Loudspeaker Mechanical Parameters by Electrical Means: A New Method for Controlling Low-Frequency Loudspeaker Behavior", 29 J. Audio Eng. Soc. 587, (1981).

Primary Examiner—Forester W. Isen
Attorney, Agent, or Firm—Spensley Horn Jubas & Lutitz

[57] ABSTRACT

A motional load driver for driving a motional load having a motional impedance includes an amplifying section for amplifying an input signal and supplying the input signal to a motional load such as a loudspeaker, a current detecting section for generating an output signal corresponding to a current flowing through the motional load, and a load impedance cancellation current generating section for generating a current corresponding to a magnitude of the output signal generated by the current detecting section and positively feeding back the current to the amplifying section. The current detecting section includes, for example, an impedance element such as a resistor series-connected to the motional load. A voltage between both the terminals of the resistor is converted into a current by a voltage/current converter arranged in the impedance cancelation current generating section, and the current is fed back to the amplifying section. With this arrangement, the motional load can be driven without being influenced by a potential difference between the input and output ground points of the amplifying section.

8 Claims, 2 Drawing Sheets

MOTIONAL LOAD DRIVER

BACKGROUND OF THE INVENTION:

1. Field of the Invention

The present invention relates to a motional load driver and, particularly, to a motional load driver for driving a motional load such as a dynamic loudspeaker while reducing distortions thereof and, more particularly, to a motional load driver which can eliminate the adverse influences of a ground potential difference in circuits in a driving operation.

2. Description of the Prior Art

A conventional motional load driver comprises a motional feedback (MFB) circuit for eliminating distortions due to the transient response of a vibration system of a dynamic loudspeaker (to be simply referred to as a loudspeaker hereinafter) using a pressure sensor, a temperature sensor, a microphone, or the like. The MFB circuit negatively feeds back a motional voltage generated by the motional impedance of the loudspeaker to the input side of a power amplifier. Instead of using the above-described sensors and the like, a bridge circuit may be used. According to this method, the bridge circuit detects a motional voltage generated at a terminal of a voice coil of a loudspeaker (refer to a monthly magazine "Radio Technique" published in Japan; Oct. Issue and Nov. Issue in 1984, and Feb. Issue in 1985).

In the MFB circuit using the above-described sensors and the like, however, a feedback quantity is limited depending on the performance of the sensor or the like, e.g., an increase in phase revolution of a detection output of the sensor (if the feedback quantity is set large, the MFB circuit starts to oscillate). For this reason, only a small distortion reducing effect of the loudspeaker can be expected.

On the other hand, in the MFB circuit using the bridge circuit, the circuit arrangement for detection becomes complicated.

As described above, the conventional drivers using the MFB circuits must detect a motional voltage. Therefore, it is impossible to sufficiently reduce distortions of a loudspeaker.

Therefore, in consideration of the fact that transient response distortions in a motional load driving operation are caused because the motional load includes impedance components, other than the motional impedance, such as DC resistance components and inductance components, the present applicant previously proposed a motional load driver which could eliminate the distortions due to the transient response by performing negative output impedance driving so as to cancel the impedance components other than the motional impedance, which is disclosed in Japanese Pat. Application No. 62-145738 corresponding to U.S. Ser. No. 199,479. FIG. 5 shows the arrangement of the driver.

Referring to FIG. 5, an input terminal 1 which receives an input voltage Vi is connected to the inverting input terminal of an operational amplifier 2 (power amplifier), through a resistor R1. The non-inverting input terminal of the operational amplifier 2 (power amplifier) is grounded. The output terminal of the operational amplifier 2 is connected to the connection point of the resistor R1 and the inverting input terminal of the amplifier 2 through a resistor R3, and at the same time is grounded through a series circuit of a load 3 (impedance ZL) as a loudspeaker and a resistor Rs. The connection point of the load 3 and the resistor Rs is connected to the connection point of the inverting input terminal and the resistors R1 and R3 through a series circuit of a gain-A amplifier 4 (servo amplifier) and a resistor R2. The amplifier 4 and the resistor Rs constitute a load impedance detecting circuit (or a load resistance detecting circuit). The main part of the present invention corresponds to the part constituted by the amplifier 4.

In this case, assuming that the voltage across the load 3 is Vo, then its transmission characteristic is represented by:

$$-Vo/Vi = (R3/R1) \cdot [1/\{1+(Rs/ZL) \cdot (1-A \cdot R3/R2)\}] \ldots \quad (1)$$

Therefore, an output impedance (drive impedance) can be given by:

$$Zo = Rs(1 - A \cdot R3/R2) \ldots \quad (2)$$

If $A \cdot R3/R2 > 1$ in equation (2), impedance components other than the motional impedance of the load impedance can be canceled by setting the output impedance Zo to be a predetermined negative value. In order to satisfy this condition, however, ground potentials E1 and E2 at the input and output sides must be equal to each other.

However, even if the motional load driver is arranged on a single substrate, it is difficult to ground the input and output sides to a single ground point. For this reason, the input and output sides are grounded at different ground points. In this case, the impedance of a ground pattern on the substrate is not zero, but a very low impedance is included in the ground pattern. As a result, a potential difference occurs between the input and output side ground points. Furthermore, in the above arrangement, a variation in motional impedance of the load 3 is detected by the detecting resistor Rs as a voltage variation, and this voltage variation is fed back to the inverting input terminal of the operational amplifier 2 through the amplifier 4. For this reason, the circuit in FIG. 5 is influenced by the potential difference between the input and output ground points.

This phenomenon will be described by using the following equation. When the ground potentials E1 and E2 on the input and output sides are different from each other, the output impedance Zo can be represented by:

$$Zo = Rs \cdot (1 - A \cdot R3/R2) \cdot [1 - (R1/R2) \cdot A \cdot (Vg/Vi)]^{-1}. \quad (3)$$

for $Vg = E2 - E1$.

As is apparent from equation (3), the output impedance Zo varies in accordance with the potential difference Vg. Distortions are generated by the influences of this potential difference Vg. In addition, the circuit operation becomes unstable.

As described above, according to the arrangement in FIG. 5, the motional load can be driven with small distortions without detecting the motional voltage. However, if a potential difference occurs between the input and output ground points when an output current value is fed back to the input side to obtain a negative output impedance, the output impedance value varies, and hence accurate cancelation cannot be realized.

SUMMARY OF THE INVENTION

The present invention has been in consideration of the above situation, and has as its object to provide a motional load driver which can always control an output impedance with accuracy without being influenced by a potential difference between input and output ground points.

According to the present invention, there is provided a motional load driver, wherein a detection voltage is fed back to an inverting input terminal of an amplifier as a current through a voltage/current converter in a load impedance cancellation arrangement.

According to the above arrangement, a voltage across a detecting resistor serves as a current forcibly flowing in and out from an imaginary ground point of an amplifier serving as an inverting amplifier. Therefore, the detected potential difference can always be fed back to the input side with accuracy without being influenced by the potential at the imaginary ground point, and negative impedance cancelation can be reliably realized.

DETAILED DESCRIPTION OF THE PREFERRED EMBODIMENTS

Figure 2:
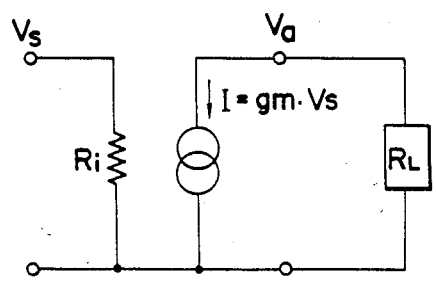
FIG. 2 is a circuit diagram showing a constant-current circuit.

In the present invention, in order to eliminate the influences of the potential difference between the input and output ground points, a voltage/current converter which exhibits a function shown in FIG. 2 is used in a load impedance cancelation arrangement.

Figure 3:
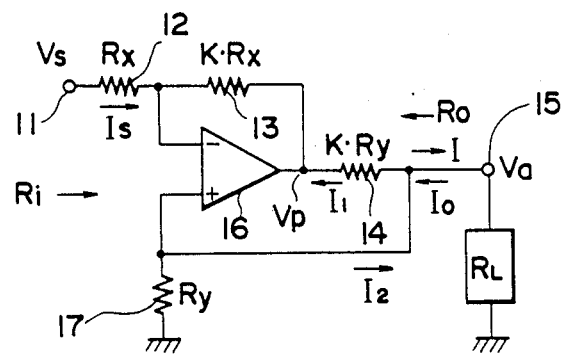
FIG. 3 is an equivalent circuit diagram of FIG. 2 showing a voltage/current converter as the main part of the present invention.

Referring to FIG. 2, reference symbol Ri denotes an input impedance of the voltage/current converter. A constant current $I = gm \cdot Vs$ (where gm is a transconductance and Vs is a detection voltage at a resistor Rs) is fed back to the input side of an amplifier 2. FIG. 3 shows an equivalent circuit of the circuit in FIG. 2. Referring to FIG. 3, reference symbol RL denotes a load impedance connected to the output of the voltage/current converter.

Referring to FIG. 3, an input terminal 11 which receives an input voltage Vs (detection voltage) is connected to an output terminal 15 through a series circuit of resistors 12 (resistance Rx), 13 (resistance K·Rx), and 14 (resistance K·Ry). The inverting input terminal of an operational amplifier 16 is connected to the connection point between the resistors 12 and 13, whereas its non-inverting input terminal is grounded through a resistor 17 (resistance Ry). In addition, the output terminal of the operational amplifier 16 is connected to the connection point between the resistors 13 and 14. The connection point between the non-inverting input terminal of the operational amplifier 16 and the resistor 17 is connected to the connection point between the resistor 14 and the output terminal 15.

A circuit (including a load impedance RL) shown in FIG. 3 will be analyzed by using the following equations. Assuming that the output voltage and the input voltage (detection voltage) of the voltage/current converter are respectively set to be Va and Vs, an output voltage Vp of the operational amplifier 16 can be represented by:

$$Vp = (1+K)Va - Vs \ldots \quad (4)$$

Therefore, a current I1 flowing through the resistor 14 is given by:

$$I1 = (Va - Vp)/(K \cdot Ry) = (Vs - Va)/Ry \ldots \quad (5)$$

and a current I2 is given by:

$$I2 = -Va/Ry \ldots \quad (6)$$

In addition, a current Io is represented by:

$$Io = -Va/RL \ldots \quad (7)$$

Since $$I1 = Io + I2 \ldots \quad (8)$$

the following equation can be established:

$$(Vs - Va)/Ry = -(Va/Ry) - (Va/RL) \ldots \quad (9)$$

Equation (9) can be rearranged as follows:

$$RL \cdot (Vs - Va) = -RL \cdot Va - Ry \cdot Va \quad (10)$$

$$RL \cdot Vs = -Ry \cdot Va$$

Therefore, a transmission characteristic can be represented by:

$$G = Va/Vs = -RL/Ry \ldots \quad (11)$$

The transconductance gm is given by:

$$\begin{aligned} gm &= -Io/Vs \\ &= -(-Va/RL)/[-(Ry \cdot Va)/RL] \\ &= -1/Ry \end{aligned} \quad (12)$$

An input current Is can be represented by:

$$\begin{aligned} Is &= (Vs - Va)/Rx = [Vs + (RL/Ry) \cdot Vs]/Rx \\ &= Vs \cdot [(1 + RL/Ry)/Rx] \end{aligned} \quad (13)$$

Therefore, an input impedance Ri is given by:

$$Ri = Vs/Is = Rx/[1 + (RL/Ry)] \ldots \quad (14)$$

On the other hand, an output impedance Ro is represented by:

$$\begin{aligned} Ro &= Va/Io = Va/(-Va/RL) \\ &= -RL \end{aligned} \quad (15)$$

In addition, an output current I is given by:

$$I = gm \cdot Vs = -Vs/Ry \ldots \quad (16)$$

As described above, the circuit shown in FIG. 3 outputs the current I in accordance with the input voltage Vs without being influenced by the load impedance RL. In addition, the output impedance Ro (including the load impedance RL when viewed from the output side) is equal in magnitude to the load impedance, and becomes a negative impedance $-ZL$.

Figure 1:
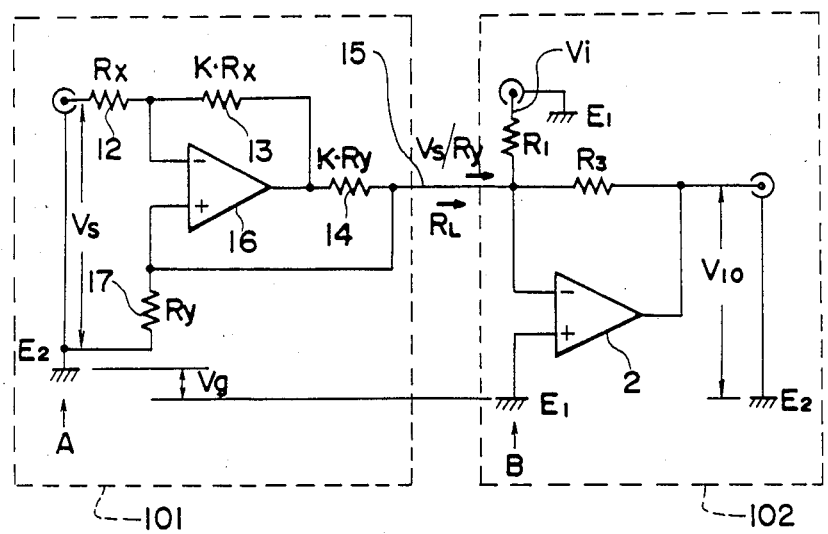
FIG. 1 is a circuit diagram showing an embodiment of the present invention.
Figure 5:
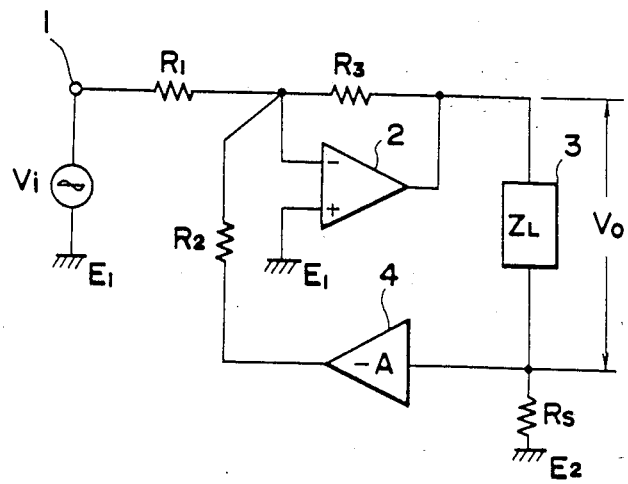
FIG. 5 is a circuit diagram showing a conventional motional load driver.

FIG. 1 is a circuit diagram showing a first embodiment of the present invention. The first embodiment comprises two substrates 101 and 102. The current-/voltage converter shown in FIG. 3 is formed on the substrate 101. A simplified circuit of the amplifying section in the motional load driver shown in FIG. 5 is formed on the substrate 102. In addition, a potential difference Vg is generated between ground points A and B of the substrates 101 and 102.

As is apparent from the above equations, the current Vs/Ry which is not influenced by the potential difference Vg is supplied from the current/voltage converter on the substrate 101. In this case, an output voltage V10 can be given by:

$$V10 = -(-Vs/Ry) \cdot R3 \ldots \quad (17)$$

Therefore, the input voltage Vs can be transmitted to an arbitrary output potential.

Figure 4:
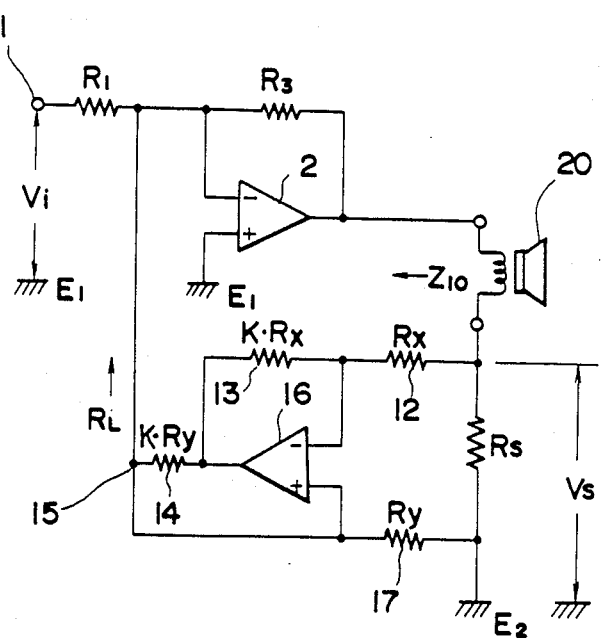
FIG. 4 is a circuit diagram showing a detailed arrangement of the embodiment of the present invention.

FIG. 4 shows a practical circuit of the first embodiment of the present invention, wherein the detection voltage Vs is detected across the detecting resistor Rs. One terminal of each of resistors 12 and 17 is connected to a corresponding terminal of the detecting resistor Rs. In addition, a loudspeaker 20 is connected to an amplifier 2 as a load.

In this case, assuming that a detection voltage across the detecting register Rs is Vs, an output impedance Z10 of the overall circuit can be represented by:

$$Z10 = Rs \cdot [1 - (R3/Ry)] \ldots \quad (18)$$

Therefore, the output impedance Z10 can be set to be a negative value by properly selecting the resistances of the resistors R3 and Ry.

Similar to the description on the embodiment of FIG. 1, in this practical circuit, load impedance canceling is free from the influences of the potential difference (E2-−E1) between the input and output ground points.

In the above-described embodiment, only the DC resistance included in the motional load is described as the impedance to be canceled. This is because a woofer is presumed as the loudspeaker 20. Inductance components of the woofer are very small in the bass range, and hence can be neglected. If inductance components of a tweeter or the like are to be canceled, the resistors Rx and Ry in the embodiment need be constituted by an impedance circuit including reactance components.

As has been described above, according to the present invention, since the load impedance cancelation arrangement is constituted by the voltage/current converter, even if a potential difference occurs between the input and output ground points of the amplifying section, the motional load can be excellently driven without being influenced by the potential difference.

What is claimed is:

1. A motional load driver for driving a motional load having a motional impedance, comprising:
   an amplifying section for amplifying an input signal and supplying the thus amplified input signal to said motional load;
   a current detecting section for generating an output voltage signal corresponding to a current flowing through said motional load; and
   a load impedance cancelation generating section for generating a current corresponding to a magnitude of the output voltage signal generated by said current detecting section and feeding back the current to said amplifying section, said load impedance cancelation current generation section comprising a voltage/current converter for converting the voltage signal into a corresponding current, said voltage/current converter comprising an amplifier having inverting and non-inverting input terminals, a first input resistor one terminal of which is connected to said inverting input terminal, a second input resistor one terminal of which is connected to said non-inverting input terminal, a feedback resistor connected between said inverting input terminal and an output of said amplifier, and an output resistor one terminal of which is connected to said output of said amplifier and the other terminal of which is connected to an output of said voltage/current converter and said non-inverting input terminal of said amplifier, the voltage signal corresponding to the current flowing through said motional load being applied between the other terminal of said first input resistor and the other terminal of said second input resistor.

2. A driver according to claim 1, wherein said amplifying section includes an inverting input terminal, and the current generated by said load impedance cancelation current generating section is fed back to said inverting input terminal.

3. A driver according to claim 1, wherein said current detecting section comprises a detecting impedance element series-connected to said motional load.

4. A driver according to claim 3, wherein said detecting impedance element comprises a resistor.

5. A driver according to claim 1, wherein a ratio of a resistance value of said feedback resistor to that of said first input resistor is equal to a ratio of the resistance value of said output resistor to that of said second input resistor.

6. A driver according to claim 1, wherein said motional load is a loudspeaker.

7. A motional load driver for driving a motional load having a motional impedance, comprising:
   an amplifying section, having an input ground point, for amplifying an input signal and supplying the amplified input signal to said motional load;
   a current detecting section for generating an output signal with reference to an output ground point corresponding to a current flowing through said motional load; and
   a load impedance cancelation current generating section for generating a feedback current corresponding to a magnitude of the output signal generated by said current detecting section and independent of any potential difference between the input and output ground points and feeding back the feedback current to said amplifying section.

8. A driver according to claim 7, wherein said motional load is a loudspeaker.

* * * * *